United States Patent
Chen et al.

(10) Patent No.: US 11,713,927 B2
(45) Date of Patent: Aug. 1, 2023

(54) HEAT DISSIPATION DEVICE

(71) Applicant: COOLER MASTER CO., LTD., Taipei (TW)

(72) Inventors: Kui-Yen Chen, Taipei (TW); Shan-Yin Cheng, Taipei (TW)

(73) Assignee: COOLER MASTER CO., LTD., Taipei (TW)

( * ) Notice: Subject to any disclaimer, the term of this patent is extended or adjusted under 35 U.S.C. 154(b) by 0 days.

(21) Appl. No.: 17/983,264

(22) Filed: Nov. 8, 2022

(65) Prior Publication Data

US 2023/0055907 A1 Feb. 23, 2023

Related U.S. Application Data

(62) Division of application No. 17/220,646, filed on Apr. 1, 2021, now Pat. No. 11,525,632.

(30) Foreign Application Priority Data

Dec. 25, 2020 (TW) .................... 109146305

(51) Int. Cl.
*F28D 15/02* (2006.01)
*F28D 1/03* (2006.01)
*F28D 21/00* (2006.01)

(52) U.S. Cl.
CPC ....... *F28D 1/0316* (2013.01); *F28D 15/0266* (2013.01); *F28D 2021/0029* (2013.01); *F28D 2021/0031* (2013.01); *F28F 2215/06* (2013.01); *F28F 2250/10* (2013.01)

(58) Field of Classification Search
CPC .............. F28D 15/0233; F28D 15/0266; F28F 2215/06; F28F 2250/10; H05K 7/20336; H05K 7/20927
See application file for complete search history.

(56) References Cited

U.S. PATENT DOCUMENTS

2005/0285261 A1* 12/2005 Prasher ................. H01L 23/427
257/E23.098
2013/0340978 A1* 12/2013 Agostini ............ H05K 7/20318
165/104.21

FOREIGN PATENT DOCUMENTS

CN         110351991 A  * 10/2019

* cited by examiner

*Primary Examiner* — Eric S Ruppert
(74) *Attorney, Agent, or Firm* — Maschoff Brennan

(57) ABSTRACT

A heat dissipation device is configured for a working fluid to flow therethrough. The heat dissipation device includes a base and at least one heat dissipation fin. The base has at least one internal channel configured for the working fluid to flow therethrough. The at least one heat dissipation fin having an extension channel and an inlet and an outlet is in fluid communication with the extension channel. The at least one heat dissipation fin is inserted into one side of the base, and the extension channel is communicated with the at least one internal channel through the inlet and the outlet.

3 Claims, 3 Drawing Sheets

HEAT DISSIPATION DEVICE

CROSS-REFERENCE TO RELATED APPLICATIONS

This non-provisional application claims priority under 35 U.S.C. § 119(a) on Patent Application No(s). 109146305 filed in Taiwan, R.O.C. on Dec. 25, 2020, the entire contents of which are hereby incorporated by reference.

TECHNICAL FIELD

This disclosure relates to a heat dissipation device, especially to a liquid-cooled heat dissipation device.

BACKGROUND

The increase in waste heat generated as the speed and frequency in electronic components are increasing. The typical heat sinks with fins made by aluminum extrusion or die-casting process have very limited surface areas, and thus its convection of the surrounding air is not as expected, even a fan is added. For this reason, the heat-sink cooling approaches are no longer suitable for dealing with the growing cooling demand.

SUMMARY

Accordingly, this disclosure provides a heat dissipation device with improved heat dissipation efficiency.

According to one or more embodiment of this disclosure, a heat dissipation device configured for a working fluid to flow therethrough comprises: a base having at least one internal channel configured for the working fluid to flow therethrough; at least one heat dissipation fin having an extension channel and an inlet and an outlet in fluid communication with the extension channel, wherein the at least one heat dissipation fin is inserted into one side of the base, and the extension channel is in fluid communication with the at least one internal channel and the outlet through the inlet, wherein the at least one internal channel has an inlet part, an outlet part, a first channel part, a second channel part, a third channel part, a fourth channel part, a fifth channel part, a sixth channel part and a plurality of connecting parts, the inlet part and the outlet part are respectively in fluid communication with the inlet and the outlet of the extension channel, the first channel part is in fluid communication with the inlet part, the second channel part is in fluid communication with the first channel part, the third channel part is in fluid communication with the second channel part, the fourth channel part is in fluid communication with the third channel part via the plurality of connecting parts, the fifth channel part is in fluid communication with the fourth channel part, the sixth channel part is in fluid communication with the fifth channel part and the outlet part.

According to the heat dissipation devices discussed in the previous embodiments, the internal channel of the base and the extension channel of the heat dissipation fin are in fluid communication with each other, thus working fluid will naturally circulate therethrough when absorbing heat, forming a three-dimensional heat transfer over the base as well as the heat dissipation fin. As such, the overall heat dissipation efficiency is improved.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 1:
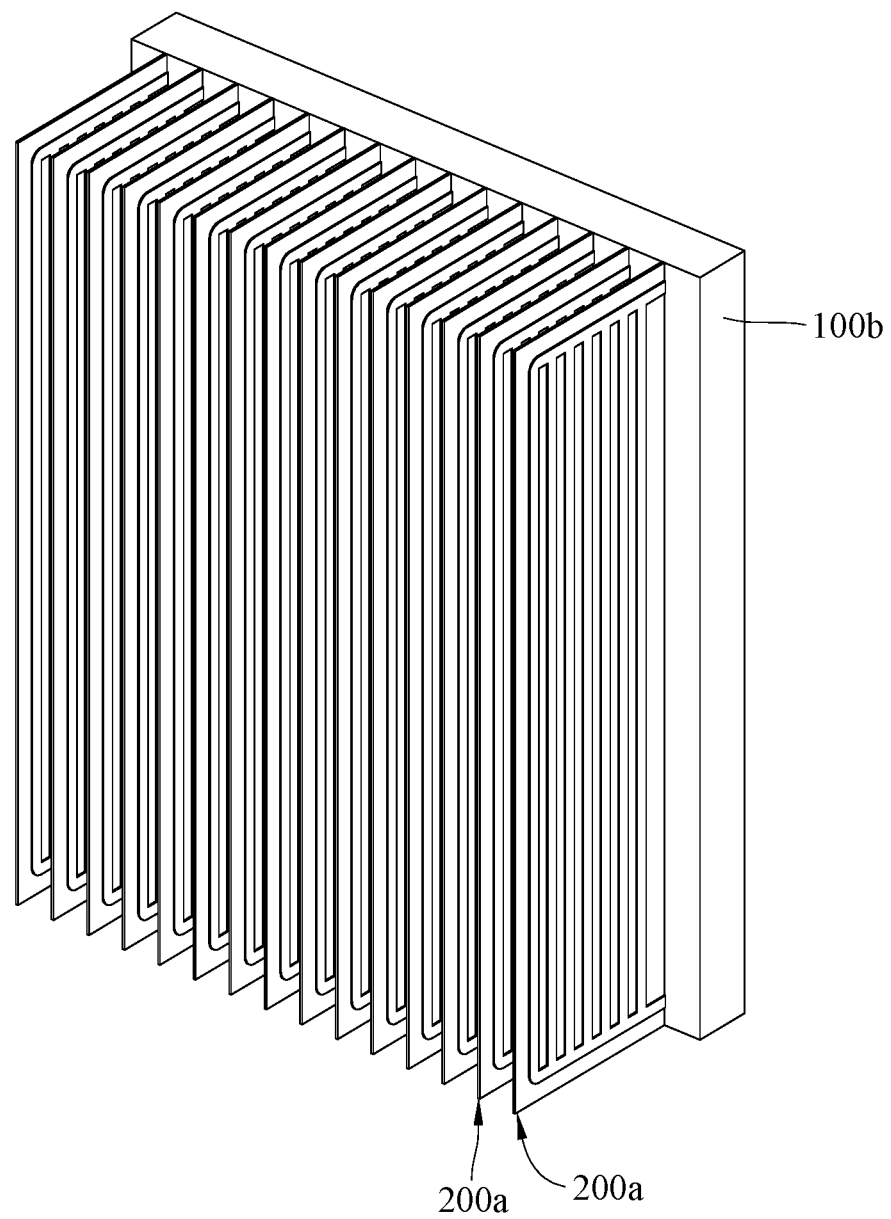
FIG. 1 is a perspective view of the heat dissipation device according to the embodiment of the present disclosure.
Figure 2:
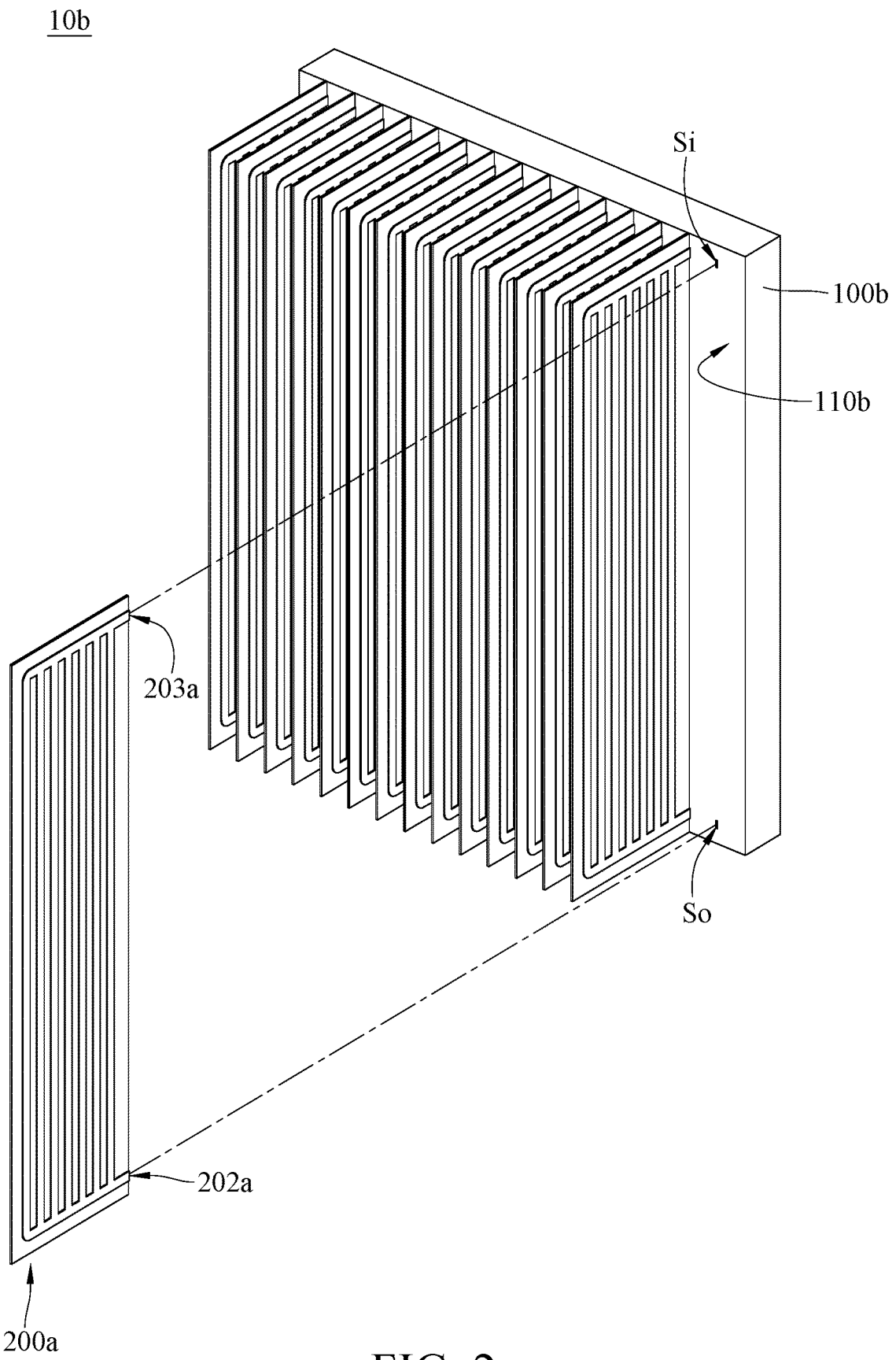
FIG. 2 is an exploded view of heat dissipation device in FIG. 1.
Figure 3:
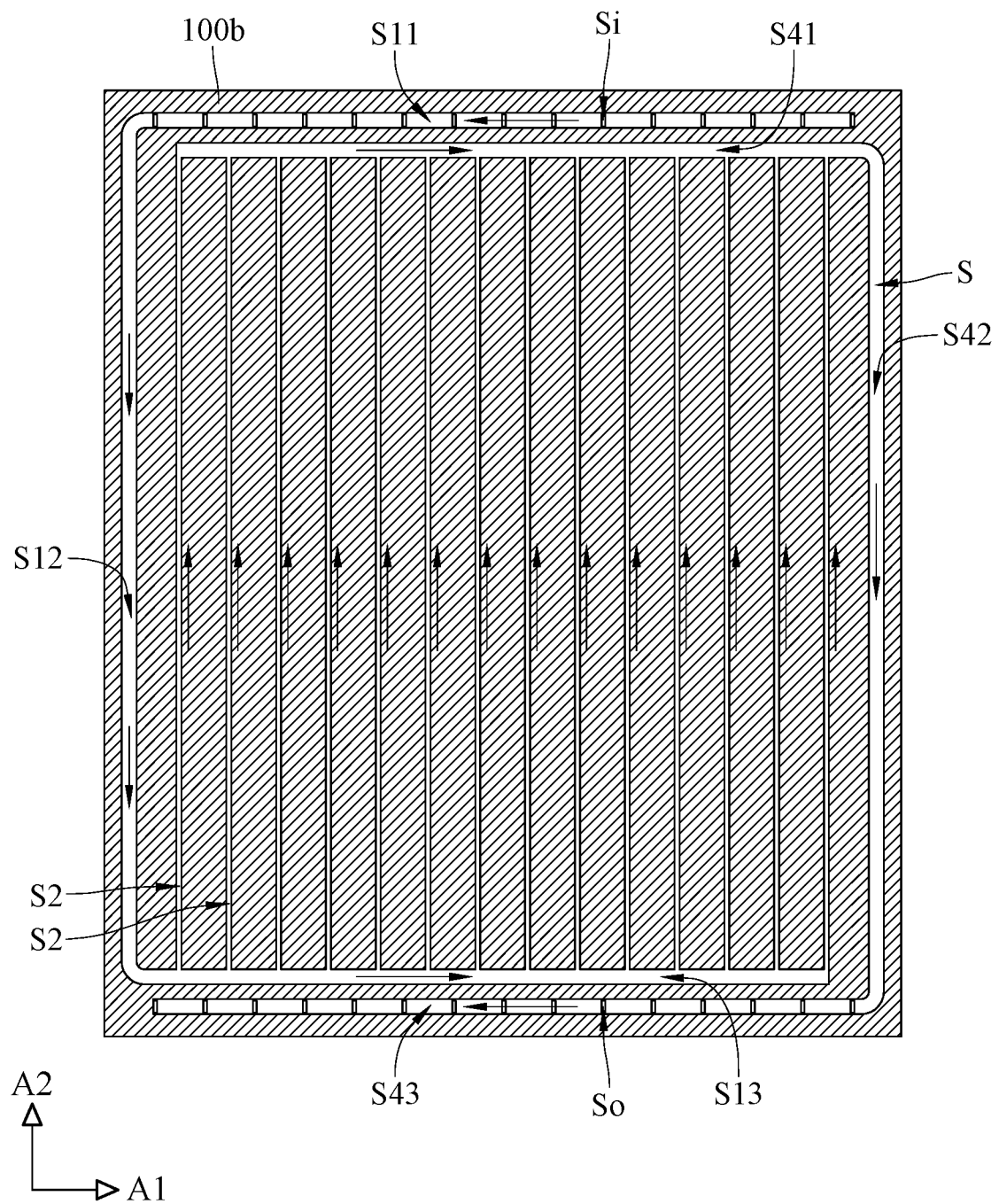
FIG. 3 is a cross-sectional view of the heat dissipation device in FIG. 1.

Please refer to FIGS. 1 to 3 where FIG. 1 is a perspective view of the heat dissipation device 10$b$ according to the second embodiment of the present disclosure, FIG. 2 is an exploded view of the heat dissipation device 10$b$, FIG. 3 is a cross-sectional view of the heat dissipation device 10$b$.

The heat dissipation device 10$b$ is used for a working fluid (not shown) to flow through. The working fluid may be water, refrigerant, or any other suitable coolant. The heat dissipation device 10$b$ comprises a base 100$b$ and a plurality of heat dissipation fins 200$a$.

The base 100$b$ has at least one internal channel S. The internal channel S is configured for the working fluid (not shown) to flow therethrough. Each of the heat dissipation fins 200$a$ has an extension channel 201$a$, and an outlet 202$a$ and an inlet 203$a$ in fluid communication with the extension channel 201$a$. Each of the heat dissipation fins 200$a$ is inserted into one side of the base 100$a$, and the extension channel 201$a$ is in fluid communication with the at least one internal channel S through the inlet 203$a$ and the outlet 202$a$.

Specifically speaking, the base 100$b$ has an internal channel S. the internal channel S is configured for a working fluid (not shown) to flow therethrough. The internal channel S has an inlet part Si, an outlet part So, a first channel part S11, a second channel part S12, a third channel part S13, a fourth channel part S41, a fifth channel part S42, a sixth channel part S43 and a plurality of connecting parts S21. The inlet part Si and the outlet part So are respectively in fluid communication with the outlet 202$a$ and the inlet 203$a$ of the extension channel 201$a$, the first channel part S11 is in fluid communication with the inlet part Si, the second channel part S12 is in fluid communication with the first channel part S11, the third channel part S13 is in fluid communication with the second channel part S12, the fourth channel part S41 is in fluid communication with the third channel part S13 via the plurality of connecting parts S21, the fifth channel part S42 is in fluid communication with the fourth channel part S41, the sixth channel part S43 is in fluid communication with the fifth channel part S42 and the outlet part So.

In this embodiment, the first channel part S11, the third channel part S13, the fourth channel part S41 and the sixth channel part S43 extend along a first direction A1, and the second channel part S12, the fifth channel part S42 and the plurality of connecting parts S21 extend along a second direction A2. The second direction A2 is substantially perpendicular to the first direction A1, but it can be modified as required; for example, the second direction A2 in other embodiments may retain as an acute or an obtuse angle with the first direction A1.

In this embodiment, widths of the plurality of connecting parts S21 are smaller than widths of the first channel part S11, the second channel part S12, the third channel part S13, the fourth channel part S41, the fifth channel part S42 and the sixth channel part S43. In other embodiments, the widths of the plurality of connecting parts may be larger than the widths of the first channel part, the second channel part, the third channel part, the fourth channel part, the fifth channel part and the sixth channel part.

The heat dissipation device 10b of this embodiment may be placed vertically. When the heat dissipation device 10b is placed vertically (the connecting parts S21 are parallel to a plumb line), the working fluid may perform a cooling circulation naturally via the heat exchange of the working fluid.

According to the heat dissipation devices discussed in the previous embodiments, the internal channel of the base and the extension channel of the heat dissipation fin are in fluid communication with each other, thus working fluid will naturally circulate therethrough when absorbing heat, forming a three-dimensional heat transfer over the base as well as the heat dissipation fin. As such, the overall heat dissipation efficiency is improved.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A heat dissipation device configured for a working fluid to flow therethrough, said heat dissipation device comprising:
   a base having at least one internal channel configured for the working fluid to flow therethrough;
   at least one heat dissipation fin having an extension channel and an inlet and an outlet in fluid communication with the extension channel, wherein the at least one heat dissipation fin is inserted into one side of the base, and the extension channel is in fluid communication with the at least one internal channel and the outlet through the inlet,
   wherein the at least one internal channel has an inlet part, an outlet part, a first channel part, a second channel part, a third channel part, a fourth channel part, a fifth channel part, a sixth channel part and a plurality of connecting parts, the inlet part and the outlet part are respectively in fluid communication with the inlet and the outlet of the extension channel, the first channel part is in fluid communication with the inlet part, the second channel part is in fluid communication with the first channel part, the third channel part is in fluid communication with the second channel part, the fourth channel part is in fluid communication with the third channel part via the plurality of connecting parts, the fifth channel part is in fluid communication with the fourth channel part, the sixth channel part is in fluid communication with the fifth channel part and the outlet part, the fourth channel part and the third channel part locate between the first channel part and the sixth channel part and the fourth channel part and the third channel part are at the same level.

2. The heat dissipation device of claim 1, wherein the first channel part, the third channel part, the fourth channel part and the sixth channel part extend along a first direction, and the second channel part, the fifth channel part and the plurality of connecting parts extend along a second direction, and the second direction is different from the first direction.

3. The heat dissipation device of claim 2, wherein widths of the plurality of connecting parts are smaller than widths of the first channel part, the second channel part, the third channel part, the fourth channel part, the fifth channel part and the sixth channel part.

* * * * *